(12) United States Patent
Nagata

(10) Patent No.: US 10,598,694 B2
(45) Date of Patent: Mar. 24, 2020

(54) INSPECTION JIG

(71) Applicant: YOKOWO CO., LTD., Kita-ku, Tokyo (JP)

(72) Inventor: Takahiro Nagata, Tomioka (JP)

(73) Assignee: YOKOWO CO., LTD., Kita-ku, Tokyo (JP)

( * ) Notice: Subject to any disclaimer, the term of this patent is extended or adjusted under 35 U.S.C. 154(b) by 0 days.

(21) Appl. No.: 16/174,426

(22) Filed: Oct. 30, 2018

(65) Prior Publication Data

US 2019/0187178 A1    Jun. 20, 2019

(30) Foreign Application Priority Data

Dec. 18, 2017    (JP) .................................. 2017-241391

(51) Int. Cl.
| | | |
|---|---|---|
| *G01R 1/04* | (2006.01) | |
| *G01R 1/067* | (2006.01) | |
| *G01R 1/073* | (2006.01) | |
| *G01R 31/02* | (2006.01) | |
| *G01R 31/28* | (2006.01) | |
| *H01R 12/00* | (2006.01) | |
| *H01R 4/48* | (2006.01) | |

(52) U.S. Cl.
CPC ..... *G01R 1/06722* (2013.01); *G01R 1/06772* (2013.01); *G01R 1/07371* (2013.01)

(58) Field of Classification Search
CPC .......... G01R 1/04; G01R 1/067; G01R 1/073; G01R 31/02; G01R 31/28; H01R 12/00; H01R 4/48
See application file for complete search history.

(56) References Cited

U.S. PATENT DOCUMENTS 4,906,920 A * 3/1990 Huff ..................... G01R 1/0735
324/73.1
5,563,521 A * 10/1996 Crumly ................ G01R 1/0735
324/754.11

OTHER PUBLICATIONS

BiTS Workshop 2007 Archive (https://www.bitsworkshop.org/archive/archive2007/2007ht.pdf), Paper#2.

* cited by examiner

*Primary Examiner* — Neel D Shah
(74) *Attorney, Agent, or Firm* — Morgan, Lewis & Bockius LLP

(57) ABSTRACT

The inspection jig includes a rigid substrate, a flexible substrate connected to the rigid substrate, a contactor block for supporting a part of the flexible substrate in a state that the part of the flexible substrate is protruded with respect to the rigid substrate, a contactor provided on a protruding portion of the flexible substrate, and a spring probe supported by the contactor block, one end of which is in contact with a contact pad provided on a lower surface of the rigid substrate, and the other end of which protrudes from a protruding portion of the flexible substrate.

6 Claims, 2 Drawing Sheets

1 INSPECTION JIG

1 INSPECTION JIG

INSPECTION JIG

CROSS REFERENCE TO RELATED APPLICATIONS

This application is based on Japanese Patent Application (No. 2017-241391) filed on Dec. 18, 2017, the contents of which are incorporated herein by way of reference.

BACKGROUND

The present invention relates to an inspection jig such as a probe card used for inspecting electrical characteristics of a semiconductor integrated circuit and the like.

In an inspection jig such as a probe card used for inspecting electrical characteristics of a semiconductor integrated circuit, a contactor including a spring probe is mounted on a rigid substrate directly.

Non-Patent Document 1: BiTS Workshop 2007 Archive (https://www.bitsworkshop.org/archive/archive2007/2007ht.pdf), PAPER#2

SUMMARY

The present invention is an inspection jig in which stable contact and excellent measurement performance of high frequency signal can be ensured.

An embodiment of the present invention provides an inspection jig. The inspection jig includes:

a rigid substrate;

a flexible substrate that is connected to the rigid substrate;

a support that supports a part of the flexible substrate in a state that the part of the flexible substrate is protruded with respect to the rigid substrate:

a contactor that is provided on a protruding portion of the flexible substrate, the protruding portion being protruded with respect to the rigid substrate; and a spring probe that is supported by the support, one end of which is in contact with a contact portion of the rigid substrate, and the other end of which protrudes from the protruding portion of the flexible substrate.

The contactor is for a high frequency signal. The spring probe is for a non-high frequency signal.

The contactor is a contact portion which is not extendable or contractible.

An elastic body that is provided between the protruding portion of the flexible substrate and the support, and presses a back surface of a portion of the flexible substrate where the contact portion is provided may be further included.

A protrusion length of the other end of the spring probe with respect to the protruding portion may be longer than a protrusion length of the contactor with respect to the protruding portion.

The support may be fixed to one surface of the rigid substrate.

The flexible substrate may include an inclined portion between both end portions and the protruding portion thereof. An electronic component provided on the flexible substrate may be disposed on the inclined portion.

DETAILED DESCRIPTION OF EXEMPLIFIED EMBODIMENT

Figure 1:
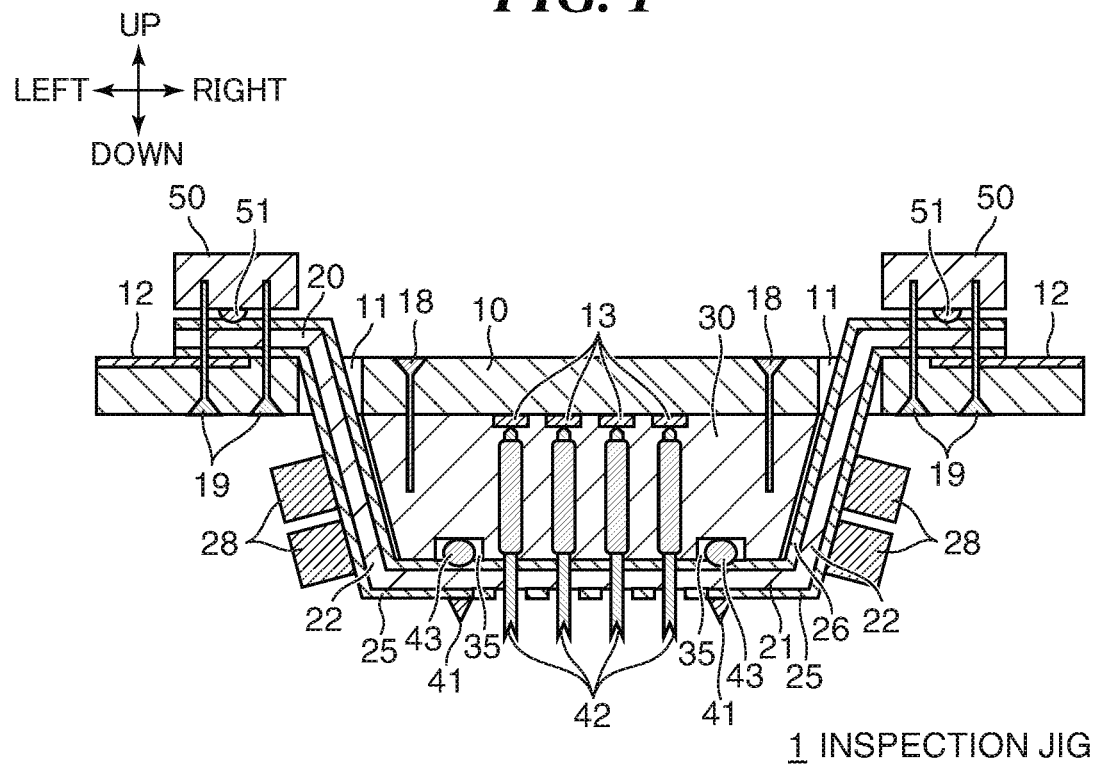
FIG. 1 is a schematic sectional view of an inspection jig 1 according to an embodiment of the invention.

When a high frequency device is inspected, a contactor as short as possible is desired as it is necessary to transmit a high frequency signal. However, if contactors including those for a low frequency signal, for a power supply, and for the ground are all made as short as the one for the high frequency signal, it is difficult to make stable contact to all terminals at the time of inspecting a device to be inspected having a large number of measurement terminals due to the shortage of contact stroke.

The present invention is an inspection jig in which stable contact and excellent measurement performance of high frequency signal can be ensured.

Hereinafter, preferred embodiments of the invention are described in detail with reference to the drawings. The same or equivalent components, members, and the like illustrated in the drawings are denoted by the same reference numerals, and descriptions of these components are not repeated. The embodiments are not intended to limit the invention. All features and combinations of these features described in the embodiments are not necessarily essential to the invention.

Figure 2:
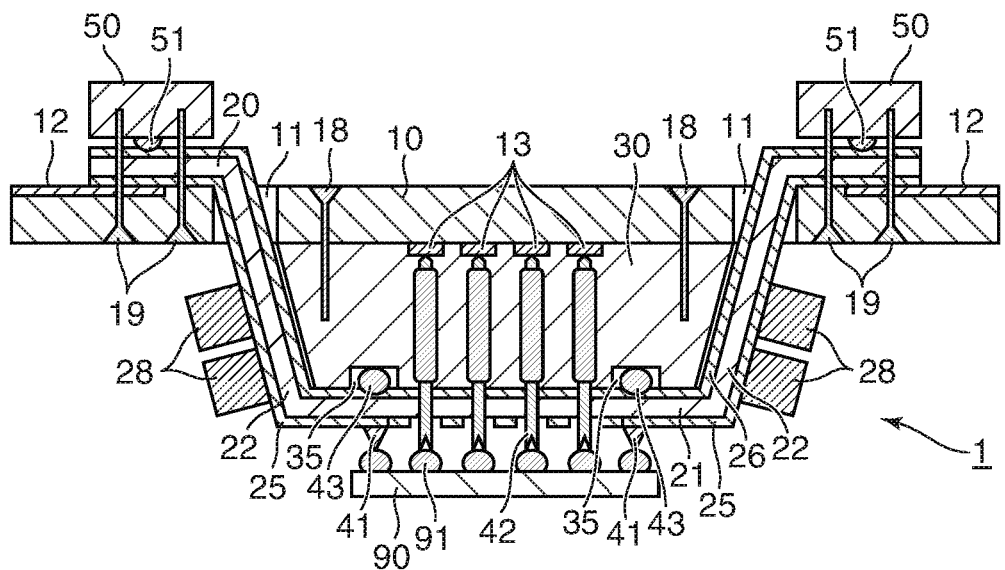
FIG. 2 is a schematic sectional view of a contactor 41 and a spring probe 42 of the inspection jig 1 in contact with bumps 91 on a to-be-measured wafer 90.

FIG. 1 is a schematic sectional view of an inspection jig 1 according to an embodiment of the invention. FIG. 2 is a schematic sectional view of a contactor 41 and a spring probe 42 of the inspection jig 1 in contact with bumps 91 on a to-be-measured wafer 90. The upper-lower direction and the left-right direction orthogonal to each other in the inspection jig 1 are defined in FIG. 1. In FIG. 1, the vertical direction of the sheet refers to the upper-lower direction, and the horizontal direction thereof refers to the left-right direction. The direction perpendicular to the upper-lower direction and the left-right direction is defined as the front-rear direction. The inspection jig 1 is, for example, a probe card, and is used for inspecting electrical characteristics of a semiconductor integrated circuit in a wafer state. The inspection jig 1 includes a rigid substrate 10, a flexible substrate 20, a contactor block (contactor housing) 30 serving as a support, a contactor 41, a spring probe 42, and a crimping block 50.

The rigid substrate 10 is made of a material that is less deformable than the flexible substrate to be described below. For example, the rigid substrate 10 is a glass epoxy substrate. The rigid substrate 10 extends perpendicularly with respect to the upper-lower direction. A pair of slit holes 11 penetrates the rigid substrate 10 vertically and extends in the front-rear direction on both left and right sides of a contactor block 30. A high frequency line (high frequency conductive pattern) 12 for transmitting a high frequency signal is provided on an upper surface of the rigid substrate 10. Although not illustrated, the rigid substrate 10 is also provided with a low frequency line (low frequency conductive pattern) for transmitting a low frequency signal, a power supply line (power supply conductive pattern), and a ground line (ground conductive pattern). A plurality of contact pads 13 serving as contact portions are provided at a portion on a lower surface of the rigid substrate 10 and between the pair of slit holes 11 (the portion covered by the contactor block 30). The contact pad 13 is a contact pad not for a high frequency signal, and includes contact pads for a low frequency signal, for a power supply, and for the ground.

The flexible substrate 20 is made of a deformable material. Both left and right end portions of the flexible substrate 20 are connected to the upper surface of the rigid substrate 10 by a pressing force of the crimping block 50. The flexible substrate 20 extends below the rigid substrate 10 through the slit holes 11. The flexible substrate 20 is protruded downward with respect to the rigid substrate 10 by a support of the contactor block 30. The flexible substrate 20 includes a protruding portion 21 that protrudes downward with respect to the rigid substrate 10. A lower surface of the protruding portion 21 is a flat surface. The lower surface of the protruding portion 21 is provided with a contactor 41 serving as a contact portion which is not extendable or contractible. The contactor 41 is a contact pad (contact bump) for a high frequency signal.

The flexible substrate 20 is provided with a high frequency line (high frequency conductive pattern) 25 on a lower surface thereof. The high frequency line 25 has one end thereof connected to the contactor 41 for a high frequency and the other end connected to the high frequency line 12 of the rigid substrate 10. The flexible substrate 20 is provided with a ground line (ground conductive pattern) 26 on an upper surface thereof. The electrical connection between the upper surface and the lower surface of the flexible substrate 20 is performed via a through hole (not illustrated) when necessary. The flexible substrate 20 includes an inclined portion 22 between the left and right end portions of the flexible substrate 20 and the protruding portion 21. A matching circuit mounted on the high frequency line 25 and an electronic component 28 (for example, a chip capacitor) connected between the power supply line and the ground line are provided on the inclined portion 22. The electronic component 28 is located above the contactor 41.

The contactor block 30 is, for example, an insulating resin molded body. The contactor block 30 is fixed to a lower surface of the rigid substrate 10 by a predetermined number of screws 18. The contactor block 30 is located between the pair of slit holes 11 in the left-right direction. The contactor block 30 has a four-sided pyramid shape having a substantially trapezoidal cross section perpendicular to the front-rear direction. The contactor block 30 is configured to support the flexible substrate 20 with a part of the flexible substrate 20 being protruded downward with respect to the rigid substrate 10. A lower surface of the contactor block 30 is a flat surface. An upper surface of the protruding portion 21 of the flexible substrate 20 is a flat surface. The upper surface of the protruding portion 21 may be in contract with a lower surface of the contactor block 30. Further, the contactor block 30 supports the spring probes (contact probes) 42 in an extendable and contractible manner.

Each of the spring probes 42 is a conductive metal such as copper or a copper alloy that extends in the upper-lower direction. The spring probes 42 include biasing means such as a coil spring (not illustrated), and are extendable and contractible in the upper-lower direction. Upper ends of the spring probes 42 are in contact with the contact pads 13 provided on the lower surface of the rigid substrate 10. The upper ends of the spring probes 42 may also be in elastic contact with the contact pads 13. Lower ends of the spring probes 42 penetrate the protruding portion 21 of the flexible substrate 20 and protrude downward. As illustrated in FIG. 1, the lower ends of the spring probes 42 are positioned lower than the contactors 41 at the time of non-inspection. As illustrated in FIG. 2, the lower ends of the spring probes 42 are in contact with the bumps 91 provided on the to-be-measured wafer 90 together with the contactor 41 during inspection. Here, the lower ends of the spring probes 42 may also be in elastic contact with the bumps 91. The contactor block 30 has a recessed portion 35 facing the upper surface of the protruding portion 21 of the flexible substrate 20 at a position immediately above the contactor 41. An elastic body 43 such as rubber provided in the recessed portion 35 presses the contactor 41 downward via the flexible substrate 20 so that the contactor 41 elastically contacts the bump 91. The elastic body 43 presses a back surface of the portion of the flexible substrate 20 where the contactor 41 is provided.

The pair of crimping blocks 50 is fixed to the upper surface of the rigid substrate 10 by a predetermined number of screws 19, so as to sandwich the left and right end portions of the flexible substrate 20 between the crimping blocks 50 and the upper surface of the rigid substrate 10. The crimping blocks 50 include elastic bodies 51 such as rubber on lower surfaces (surfaces on the rigid substrate 10 side) of the crimping blocks 50. The elastic bodies 51 are configured to press both the left and right end portions of the flexible substrate 20 to the upper surface of the rigid substrate 10 in an elastic manner. In this way, the high frequency line 12 provided on the upper surface of the rigid substrate 10 and the high frequency line 25 provided on the lower surface of the flexible substrate 20 are electrically connected to each other.

Figure 3:
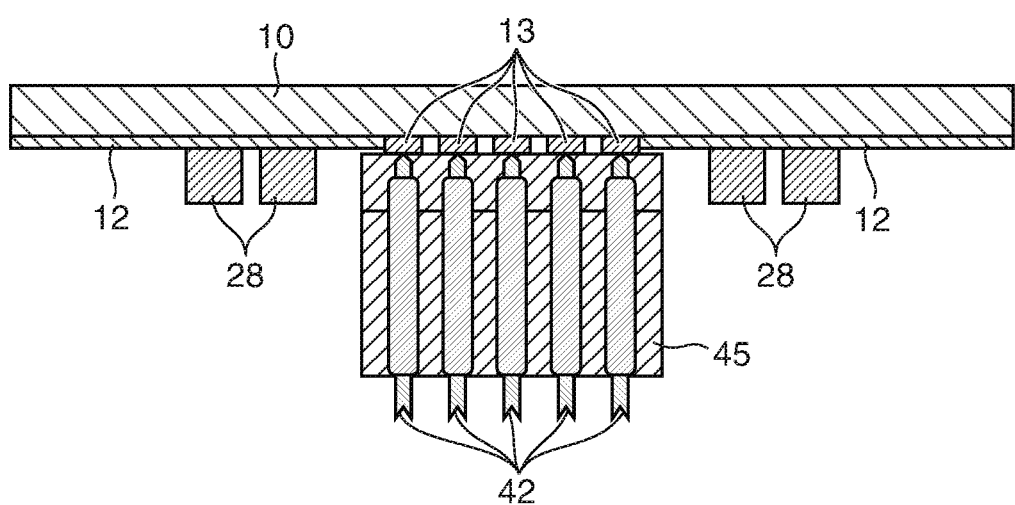
FIG. 3 is a schematic sectional view of an inspection jig according to a comparative example.

FIG. 3 is a schematic sectional view of an inspection jig according to a comparative example. In the inspection jig according to the comparative example, the plurality of spring probes 42 and a contact housing 45 supporting the spring probes 42 are mounted on the rigid substrate 10 directly, and the spring probes 42 having the same length are used for a high frequency signal in addition to a low frequency signal, a power supply, and the ground. In such a configuration, if the length of the spring probe 42 in the upper-lower direction is shortened so as to transmit a high frequency signal, it is difficult to make stable contact to all terminals at the time of inspecting a device to be inspected having a large number of measurement terminals due to the shortage of contact stroke. Further, if the length of the spring probe 42 in the upper-lower direction is shortened to a certain length or less, the electronic component 28 and an attachment mechanism (not shown) interfere with the bumps 91 on the to-be-measured wafer 90 during inspection, and thus the spring probe 42 having the certain length or less in the upper-lower direction cannot be used. On the other hand, if the spring probe 42 is lengthened to sufficiently secure the contact stroke, transmission performance of the high frequency signal deteriorates.

According to the embodiment, the following effects can be achieved.

(1) The flexible substrate 20 is protruded downward with respect to the rigid substrate 10 by the contactor block 30, the short contactor 41 for a high frequency signal is provided on the lower surface of the protruding portion 21, while the long spring probe 42 not for a high frequency signal is supported by the contactor block 30 and the upper end of the spring probe 42 is in contact (elastic contact) with the contact pad 13 provided on the lower surface of the rigid substrate 10. Thereby, the measurement performance of the high frequency signal is increased by the short contactor 41 and a stable contact can be made by the spring probe 42 which can secure a sufficient contact stroke. Therefore, as a whole, the inspection jig 1 can ensure excellent measurement performance of high frequency signal and stable contact even if the to-be-measured wafer 90 has a large number of terminals.

(2) The electronic component 28 and the attachment mechanism (not shown) are less likely to interfere with the bumps 91 of the to-be-measured wafer 90 during inspection even if the length of the contactor 41 in the upper-lower direction is shortened since the short contactor 41 is mounted on the lower surface of the protruding portion 21 of the flexible substrate 20, and the electronic component 28 is mounted on the inclined portion 22. Therefore, the length of the contactor 41 in the upper-lower direction can be shortened, which is advantageous for the measurement performance of high frequency signal.

(3) The contactor block 30 is fixed to the rigid substrate 10 and the contactor 41 is pressed downward by the elastic body 43 provided between (recessed portion 35) the protruding portion 21 of the flexible substrate 20 and the lower surface of the contactor block 30. Thereby, it is possible to suppress contact failure due to inclination of the contactor block 30 with respect to the rigid substrate 10 as compared with a configuration in which the contactor block 30 is biased downward with respect to the rigid substrate 10 by a spring and the like instead of being fixed thereto.

While the invention has been described with reference to the embodiments, it is obvious to those skilled in the art that various modifications may be made to constituent elements and processes in these embodiments within the scope of the claims. Hereinafter, a modification will be described.

The contactor 41 may be one in which a short spring probe (contact probe) is supported by a housing, and may be formed by blending (mixing) a conductive powder such as a metal powder as a conductive material in an elastic body such as rubber. The contactor 41 may be, for example, a conductive rubber sheet. In this case, the recessed portion 35 and the elastic body 43 of the contactor block 30 can be omitted.

According to the present invention, an inspection jig can be provided in which stable contact and excellent measurement performance of high frequency signal can be ensured.

What is claimed is:

1. An inspection jig comprising: a rigid substrate;
a flexible substrate that is connected to the rigid substrate;
a support that supports a part of the flexible substrate in a state that the part of the flexible substrate is protruded with respect to the rigid substrate;
a contactor that is provided on a protruding portion of the flexible substrate, the protruding portion being protruded with respect to the rigid substrate; and
a spring probe that is supported by the support, one end of which is in contact with a contact portion of the rigid substrate, and the other end of which protrudes from the protruding portion of the flexible substrate.

2. The inspection jig according to claim 1,
wherein the contactor is for a high frequency signal, and
wherein the spring probe is for a non-high frequency signal.

3. The inspection jig according to claim 1,
wherein the contactor is a contact portion which is not extendable or contractible, and
wherein an elastic body that is provided between the protruding portion of the flexible substrate and the support, and presses a back surface of a portion of the flexible substrate where the contact portion is provided is further included.

4. The inspection jig according to claim 1,
wherein a protrusion length of the other end of the spring probe with respect to the protruding portion is longer than a protrusion length of the contactor with respect to the protruding portion.

5. The inspection jig according to claim 1,
wherein the support is fixed to one surface of the rigid substrate.

6. The inspection jig according to claim 1,
wherein the flexible substrate includes an inclined portion between both end portions and the protruding portion thereof, and
wherein an electronic component provided on the flexible substrate is disposed on the inclined portion.

* * * * *